(12) United States Patent
Tsuyutani et al.

(10) Patent No.: US 9,635,756 B2
(45) Date of Patent: Apr. 25, 2017

(54) CIRCUIT BOARD INCORPORATING SEMICONDUCTOR IC AND MANUFACTURING METHOD THEREOF

(71) Applicant: TDK Corporation, Tokyo (JP)

(72) Inventors: Kazutoshi Tsuyutani, Tokyo (JP); Hiroshige Ohkawa, Tokyo (JP); Yoshihiro Suzuki, Tokyo (JP); Tsuyoshi Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 506 days.

(21) Appl. No.: 14/032,093

(22) Filed: Sep. 19, 2013

(65) Prior Publication Data

US 2014/0085854 A1 Mar. 27, 2014

(30) Foreign Application Priority Data

Sep. 21, 2012 (JP) .................. 2012-208566

(51) Int. Cl.
*H05K 1/16* (2006.01)
*H05K 1/03* (2006.01)
*H05K 3/30* (2006.01)
*H05K 1/18* (2006.01)
*H05K 3/00* (2006.01)
(Continued)

(52) U.S. Cl.
CPC ........... *H05K 1/03* (2013.01); *H01L 21/4846* (2013.01); *H01L 23/13* (2013.01); *H01L 23/5389* (2013.01); *H01L 24/19* (2013.01); *H05K 1/188* (2013.01); *H05K 3/007* (2013.01); *H05K 3/305* (2013.01); *H01L 21/568* (2013.01); *H01L 23/49572* (2013.01); *H01L 2224/04105* (2013.01); *H01L 2224/32245* (2013.01); *H01L 2224/92244* (2013.01); *H01L 2924/18162* (2013.01); *H05K 2201/068* (2013.01); *H05K 2203/0152* (2013.01); *Y10T 29/4913* (2015.01)

(58) Field of Classification Search
USPC .................................. 361/766, 783
See application file for complete search history.

(56) References Cited

U.S. PATENT DOCUMENTS

2010/0108371 A1 5/2010 Furutani et al.
2011/0201155 A1* 8/2011 Kuroda ............... H01L 21/4853
438/113

(Continued)

FOREIGN PATENT DOCUMENTS

CN 101256965 A 9/2008
CN 102132639 A 7/2011
(Continued)

*Primary Examiner* — Andargie M Aychillhum
(74) *Attorney, Agent, or Firm* — McGinn IP Law Group, PLLC.

(57) ABSTRACT

Disclosed herein is a manufacturing method of a circuit board. The manufacturing method includes a first step for preparing a prepreg in which a core material is impregnated with an uncured resin. The prepreg has a through-hole surrounded by the core material and the resin so as to penetrate through the core material and the resin. The manufacturing method further includes a second step for housing a semiconductor IC in the through-hole, and a third step for pressing the prepreg so that a part of the resin flows into the through-hole to allow the semiconductor IC housed in the through-hole to be embedded in the resin.

20 Claims, 9 Drawing Sheets

(51) Int. Cl.
*H01L 23/00* (2006.01)
*H01L 23/13* (2006.01)
*H01L 21/48* (2006.01)
*H01L 23/538* (2006.01)
*H01L 21/56* (2006.01)
*H01L 23/495* (2006.01)

(56) References Cited

U.S. PATENT DOCUMENTS

2011/0290546 A1* 12/2011 Lee .................. H01L 21/568
174/260
2012/0228012 A1 9/2012 Yoshikawa et al.

FOREIGN PATENT DOCUMENTS

| | | |
|---|---|---|
| JP | 2002-246761 A | 8/2002 |
| JP | 2005-142452 A | 6/2005 |
| JP | 2006-196785 A | 7/2006 |
| JP | 2007-535157 A | 11/2007 |
| JP | 2008-270633 A | 11/2008 |
| WO | WO 2005/104636 A1 | 11/2005 |

* cited by examiner

CIRCUIT BOARD INCORPORATING SEMICONDUCTOR IC AND MANUFACTURING METHOD THEREOF

BACKGROUND OF THE INVENTION

Field of the Invention

The present invention relates to a circuit board incorporating a semiconductor IC and a manufacturing method thereof, and particularly to an ultrathin circuit board incorporating a semiconductor IC and a manufacturing method thereof.

Description of Related Art

In a typical printed-circuit board, a plurality of electronic devices such as semiconductor ICs are mounted on a surface of the circuit board. The electronic devices mounted on the circuit board are electrically connected to one another through a wiring layer provided inside the circuit board. In a typical printed-circuit board, however, it is difficult to make thinner because a semiconductor IC is mounted on a surface of the circuit board. Therefore, as for a printed-circuit board for devices that are required to be thin, such as smartphones, a semiconductor IC is not mounted on a surface of the circuit board but embedded within the circuit board made of resin (See Japanese Patent Application Laid-Open No. 2002-246761).

However, in a circuit board incorporating a semiconductor IC disclosed in Japanese Patent Application Laid-Open No. 2002-246761, a semiconductor IC is housed in a concave section that is provided in a core layer of the circuit board. Therefore, the core layer exists even below the semiconductor IC. As a result, it is difficult to make the circuit board thinner as a whole. One possible way to make the circuit board thinner as a whole is to remove the core layer below the semiconductor IC. In this case, however, it is impossible to appropriately hold the semiconductor IC.

SUMMARY

It is therefore an object of the present invention to provide a thinner circuit board incorporating a semiconductor IC and a manufacturing method thereof.

In one aspect of the present invention, there is provided a circuit board that includes: a resin substrate including a core section in which a core material is impregnated with a resin and a housing section filled by the resin, the housing section being surrounded by the core section so as to penetrate through the core section; and a semiconductor IC embedded in the resin that fills the housing section.

According to the above aspect of the present invention, the semiconductor IC is embedded in the housing section that is so provided as to penetrate through the core section. Therefore, there is no core section above and below the semiconductor IC. Therefore, it is possible to make the thickness very thin as a whole. Moreover, the resin with which the core section is impregnated is the same as the resin that fills the housing section. Therefore, deformation or the like that is attributable to a difference in thermal expansion coefficient or the like does not occur.

The circuit board of the present invention preferably further includes: a wiring layer formed on one surface of the resin substrate and electrically connected to an external terminal of the semiconductor IC; and a resist film covering the wiring layer. According to this feature, it is possible to electrically connect the external terminal of the semiconductor IC to outside in a simple structure.

In the circuit board of the present invention, the other surface of the resin substrate is preferably free from any wiring layer. According to this feature, the thickness as a whole can be made thinner because there is only one wiring layer.

In the circuit board of the present invention, the housing section is preferably thinner than the core section, thereby at least one of the one and other surfaces of the resin substrate has a dented shape in the housing section. According to this feature, the resin substrate can be made thinner in a portion where the semiconductor IC is incorporated.

In the circuit board of the present invention, the semiconductor IC includes a main surface where an external terminal is provided and a back surface opposite to the main surface, a first portion of one of the main and back surfaces of the semiconductor IC is preferably covered with an adhesive agent, and a second portion of the one of the main and back surfaces of the semiconductor IC is preferably covered with the resin. Alternatively, the semiconductor IC includes a main surface where an external terminal is provided and a back surface opposite to the main surface, one of the main and back surfaces of the semiconductor IC is preferably partially covered with the resin, and the other of the main and back surfaces of the semiconductor IC is preferably entirely covered with the resin. According to this feature, a difference in thermal expansion coefficient between a region above the semiconductor IC and a region below the semiconductor IC is reduced. As a result, the semiconductor IC becomes unlikely to be warped or crack.

In this case, the other of the main and back surfaces of the semiconductor IC is preferably entirely covered with the resin. In particular, it is more preferred that, the semiconductor IC has a side surface that is preferably free from the adhesive agent. According to this feature, it is possible to reliably protect the semiconductor IC and to prevent the semiconductor IC from being warped or cracked. Moreover, in a production process, it is possible to prevent the adhesive agent from adhering to a head portion of a mounting tool that handles the semiconductor IC.

In another aspect of the present invention, there is provided a manufacturing method of a circuit board, the method includes: a first step for preparing a prepreg in which a core material is impregnated with an uncured resin, the prepreg having a through-hole surrounded by the core material and the resin so as to penetrate through the core material and the resin; a second step for housing a semiconductor IC in the through-hole; and a third step for pressing the prepreg so that a part of the resin flows into the through-hole to allow the semiconductor IC housed in the through-hole to be embedded in the resin.

According to the above aspect of the present invention, there is no core material above and below the semiconductor IC. The semiconductor IC is embedded in the resin. Therefore, a structure in which no core material exists above and below the semiconductor IC can be obtained. Moreover, the resin with which the core is impregnated is the same as the resin in which the semiconductor IC is embedded. Therefore, deformation or the like that is attributable to a difference in thermal expansion coefficient or the like does not occur.

In the manufacturing method of a circuit board, the second step preferably includes: a step for mounting the semiconductor IC on a carrier; and a step for attaching the prepreg to the carrier such that the semiconductor IC is in the through-hole. According to this feature, it is possible to properly handle a very thin prepreg and to press.

In the manufacturing method of a circuit board, the step of mounting the semiconductor IC preferably includes: a step for attaching a first metallic foil to the carrier; a step for applying an adhesive agent onto the first metallic foil; and a step for mounting the semiconductor IC on the adhesive agent to bond the semiconductor IC to the first metallic foil. According to this feature, because there is the first metallic foil between the carrier and the semiconductor IC, the carrier can be easily handled.

In the manufacturing method of a circuit board, the third step is preferably performed by pressing after a second metallic foil is attached to the prepreg such that upper and lower sides of the through-hole are covered with the first metallic foil and the second metallic foil, respectively. According to this feature, a surface position of the resin flowing into the through-hole can be properly defined by the first metallic foil and the second metallic foil.

The manufacturing method of a circuit board preferably further includes: a fourth step for patterning the first metallic foil; a fifth step for forming a via in one of the resin and adhesive agent to expose an external terminal of the semiconductor IC by using the first metallic foil as a mask that is patterned by the fourth step; and a sixth step for forming a wiring layer electrically connected to the external terminal by filling the via with a conductive material. According to this feature, the semiconductor IC can be mounted face-down manner, and the first metallic foil can be used as a mask.

The manufacturing method of a circuit board preferably further includes: a fourth step for patterning the second metallic foil; a fifth step for forming a via in the resin to expose an external terminal of the semiconductor IC by using the second metallic foil as a mask that is patterned by the fourth step; and a sixth step for forming a wiring layer electrically connected to the external terminal by filling the via with a conductive material. According to this feature, the semiconductor IC can be mounted face-up manner, and the second metallic foil can be used as a mask.

In the manufacturing method of a circuit board, the step for bonding the semiconductor IC is preformed such that the semiconductor IC is bonded such that a first portion of one of main and back surfaces of the semiconductor IC is in contact with the adhesive agent and that a second portion is not in contact with the adhesive agent. In particular, it is more preferred that the step for bonding the semiconductor IC is preformed such that a side surface of the semiconductor IC is not in contact with the adhesive agent. According to this feature, it is possible to prevent the adhesive agent from adhering to a head portion of amounting machine that handles the semiconductor IC.

In that manner, according to the present invention, it is possible to provide a thinner circuit board incorporating a semiconductor IC and a manufacturing method thereof.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

A preferred embodiments of the present invention will now be explained in detail with reference to the drawings.

Figure 1:
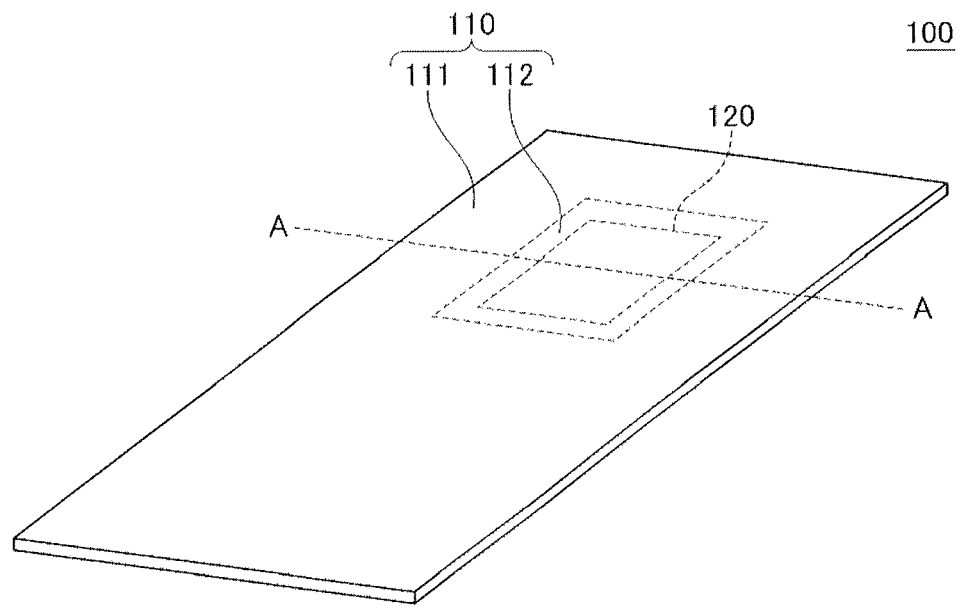
FIG. 1 is a schematic perspective view showing the appearance of a circuit board incorporating a semiconductor IC according to a first preferred embodiment of the present invention.
Figure 2:
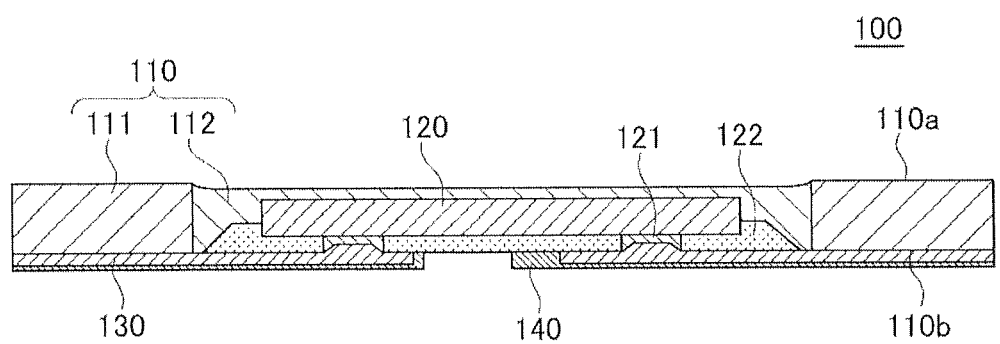
FIG. 2 is a cross-sectional view of FIG. 1 taken along line A-A.

FIG. 1 is a schematic perspective view showing the appearance of a circuit board 100 incorporating a semiconductor IC according to the first preferred embodiment of the present invention. FIG. 2 is a cross-sectional view of FIG. 1 taken along line A-A.

As shown in FIGS. 1 and 2, the circuit board 100 of the present embodiment includes a resin substrate 110 and a semiconductor IC 120 that is embedded in the resin substrate 110. The resin substrate 110 is of an ultrathin type, and is about 90 to 100 µm in thickness. Accordingly, the semiconductor IC 120 embedded in the resin substrate 110 also needs to be of an ultrathin type. For example, the semiconductor IC 120 is made thinner, and is about 40 µm in thickness.

The resin substrate 110 includes a core section 111 that contains a core material and a housing section 112 that does not contain a core material. The housing section 112 is so provided as to be surrounded by the core section 111 in planar view, and to vertically penetrate through the core section 111. The housing section 112 is filled with the same resin with which the core section 111 is impregnated. In the resin that fills the housing section 112, the semiconductor IC 120 is embedded. In other words, the resin substrate 110 has a region where the core material exists and a region where the core material does not exist in planar view. The semiconductor IC 120 is embedded in the region where the core material does not exist. As for the thickness of the resin substrate 110, the housing section 112 is slightly thinner than the core section 111. Therefore, a surface 110a of the resin substrate 110 is slightly dented in the housing section 112. Such a shape is obtained by a manufacturing method described later. The dent helps to make, if only partially, the resin substrate 110 thinner.

As a material of the resin used for the core section 111 and the housing portion 112, thermosetting resin such as glass epoxy resin may be used. As the core material used for the core section 111, resin fiber such as glass fiber or aramid fiber, or the like may be used.

The semiconductor IC 120 is an electronic device in which active elements such as transistors and passive elements such as capacitors are integrated on a semiconductor substrate that is made of silicon (Si), gallium arsenide compound (GaAs), or the like. The thickness of the semiconductor IC 120 at manufacturing stage is, for example, about 700 μm. In a final stage of the manufacturing process, a back surface of the semiconductor substrate is ground to decrease the thickness of the semiconductor IC 120 to about 40 μm. The circuit board 100 of the present embodiment uses the semiconductor IC 120 that has been made thinner as described above.

On a main surface of the semiconductor IC 120, a plurality of external terminals 121 that are called pad electrodes are provided. The external terminals 121 are connected to a wiring layer 130 that is formed on a surface 110b of the resin substrate 110. The wiring layer 130 is covered with a resist film 140 except sections that are electrically connected to outside (or sections indicated by reference symbol 131 as described later). The main surface of the semiconductor IC 120 is bonded to the wiring layer 130 with a die attach paste 122, which is an adhesive agent.

The circuit board 100 of the present embodiment includes only one wiring layer 130 that is provided on the surface 110b of the resin substrate 110. On the surface 110a of the resin substrate 110, no wiring layer is provided. As a result, the entire surface 110a of the resin substrate 110 is exposed to the outside.

The circuit board 100 of the present embodiment is configured as describe above. As described above, according to the circuit board 100 of the present embodiment, the semiconductor IC 120 is embedded in the housing section 112 that is so provided as to penetrate through the core section 111. Therefore, there is no core material above and below the semiconductor IC 120. Moreover, because the wiring layer 130 is formed only on one surface 110b of the resin substrate 110 and no wiring layer is formed on the other surface 110a, minimizing the thickness related to the wiring layer. Furthermore, the semiconductor IC 120 is bonded to the wiring layer 130, and therefore is held. Therefore, there is no need to dispose a support member for holding the semiconductor IC 120 above or below the semiconductor IC 120. Because of the above features, the circuit board 100 of the present embodiment is ultrathin, and is about 90 to 100 μm in thickness.

The following describes a method of manufacturing the circuit board 100 according to the present embodiment.

FIGS. 3A to 3E, 4A to 4E and 5A to 5D are work-flow charts illustrating the manufacturing method of the circuit board 100 according to the first embodiment.

Figure 3A:
FIGS. 3A to 3E, 4A to 4E and 5A to 5D are work-flow charts illustrating the manufacturing method of the circuit board incorporating a semiconductor IC according to the first embodiment.
Figure 3B:
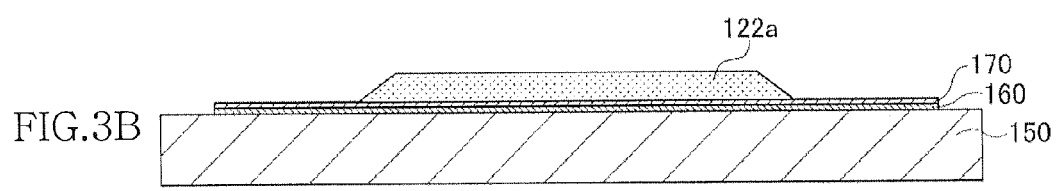
Figure 3C:
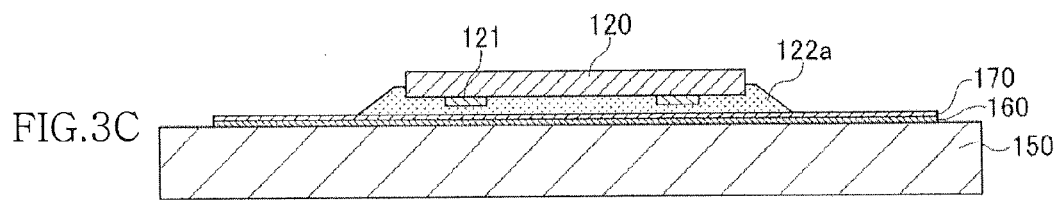

First, as shown in FIG. 3A, a carrier 150 that is made of a metallic material such as stainless steel is prepared, and metallic foil 170 is bonded to a surface of the carrier 150 by an adhesive sheet 160. Although not specifically limited, it is preferred that copper (Cu) be used as a material of the metallic foil 170. Then, as shown in FIG. 3B, an uncured die attach paste 122a is supplied onto a surface of the metallic foil 170. As shown in FIG. 3C, the semiconductor IC 120 is mounted on the die attach paste 122a while positioning is carried out. Although not specifically limited, it is preferred that the die attach paste 122a do not contain a filler. The reason is that, if the die attach paste 122a contains a filler of a relatively large diameter, the filler might be stuck between the semiconductor IC 120 and the metallic foil 170, possibly damaging the semiconductor IC 120 due to pressure given at the time of the mounting.

Figure 3D:
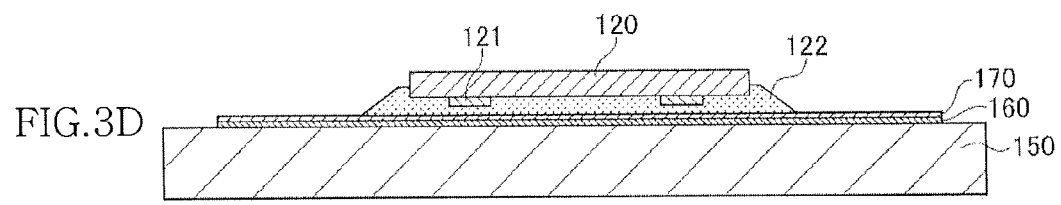

The mounting of the semiconductor IC 120 is carried out in such a way that the main surface where the external terminals 121 are formed faces a lower side (or the die attach paste 122a's side), i.e. a so-called face-down method. Then, the die attach paste 122a is cured thermally, or by ultraviolet rays. Thus, as shown in FIG. 3D, the semiconductor IC 120 is therefore fixed to the carrier 150.

Figure 3E:
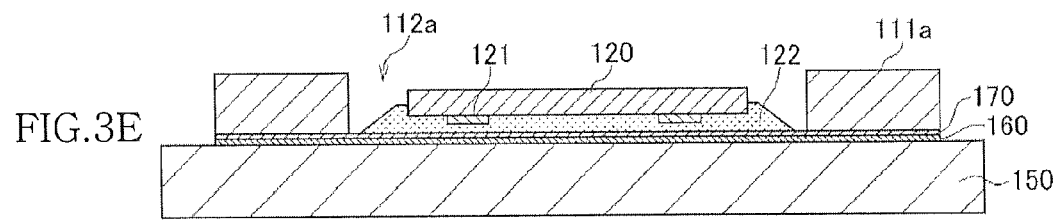
Figure 6:
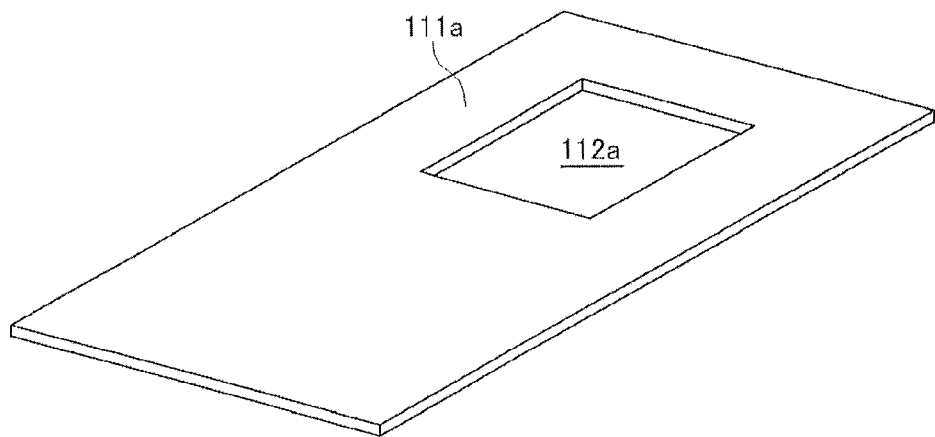
FIG. 6 is a schematic perspective view showing a prepreg.

In this state, a prepreg 111a having a shape shown in FIG. 6 is bonded onto the carrier 150. The prepreg 111a shown in FIG. 6 is a precursor of the core section 111 in which the core material is impregnated with uncured resin. The prepreg 111a has a through-hole 112a, which later becomes the housing section 112. The planar size of the through-hole 112a is set in such a way as to be slightly larger than the planar size of the semiconductor IC 120. Then, as shown in FIG. 3E, the prepreg 111a is bonded to the carrier 150 in such a way that the semiconductor IC 120 is housed in the through-hole 112a. As a result, the four sides of the semiconductor IC 120 are surrounded by the prepreg 111a.

Figure 4A:
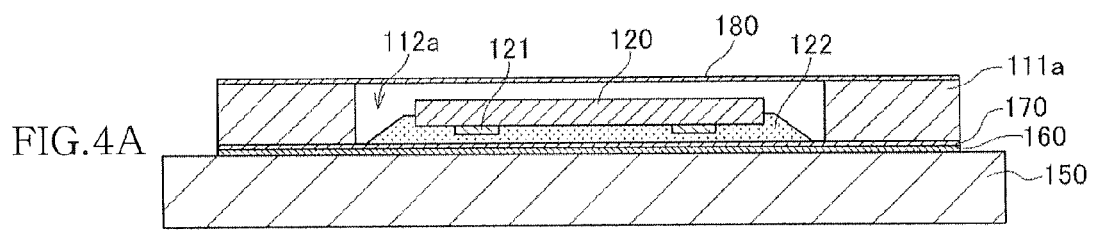
Figure 4B:
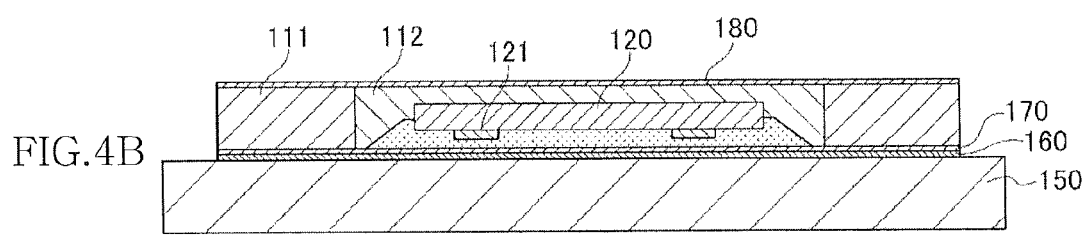

Then, as shown in FIG. 4A, metallic foil 180 is bonded in such a way as to cover the prepreg 111a. Although not specifically limited, it is preferred that copper (Cu) be used as a material of the metallic foil 180. As a result, the upper and lower sides of the through-hole 112a in which the semiconductor IC 120 is housed are covered with the metallic foils 170 and 180. In this state, the upper and lower sides of the prepreg 111a are thermally pressed. As shown in FIG. 4B, because of the pressure of the thermal pressing, part of the resin with which the prepreg 111a is impregnated flows into the through-hole 112a, and the semiconductor IC 120 that is housed in the through-hole 112a is embedded in the resin that has flowed in. Then, because of a high temperature at the time of the thermal pressing, the resin with which the prepreg 111a is impregnated and the resin that has flowed into the through-hole 112a are thermally cured. In this manner, the cured core section 111 and the housing section 112 are obtained.

As the above thermal pressing is carried out, part of the resin flows into the through-hole 112a, reducing the amount of resin contained in the core section 111 accordingly. Therefore, the thickness of the prepreg 111a is preferably set with the above fact taken into consideration. The housing section 112 is formed with the resin that has flowed out of the prepreg 111a. Therefore, the thickness thereof is slightly less than the thickness of the core section 111. Therefore, the housing section 112 becomes thinner than the core section 111 if the core material that constitutes the prepreg 111a is optimized and the volume of the uncured resin and the volume of the through-hole 112a are optimized. As a result, the product can be made extremely thin.

Incidentally, during the thermal pressing, pressure is not necessarily applied at the same time when a high temperature is applied. After part of the resin flows into the through-hole 112a due to the applying of the pressure, a high temperature maybe applied to thermally cure the resin. Alternatively, a resin that is not thermosetting maybe used. In this case, after pressing is performed to make part of the resin flow into the through-hole 112a, ultraviolet rays may be emitted, or other operations may be performed, to thermally cure the resin. It is preferred that the thermal pressing or the pressing be carried out under reduced pressure. In this case, it is possible to prevent air bubbles from entering the housing section 112.

Figure 4C:
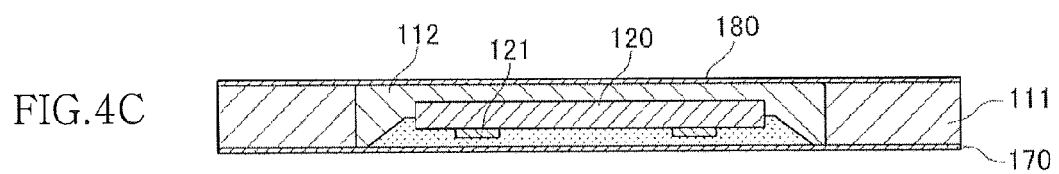
Figure 4D:
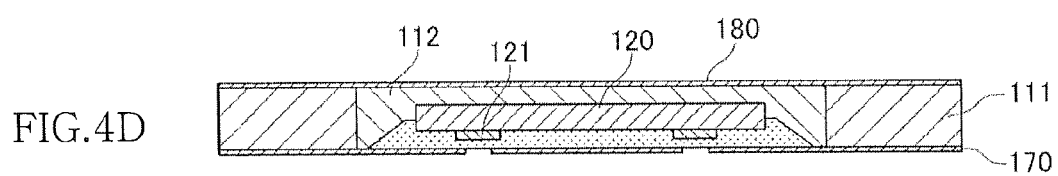
Figure 4E:
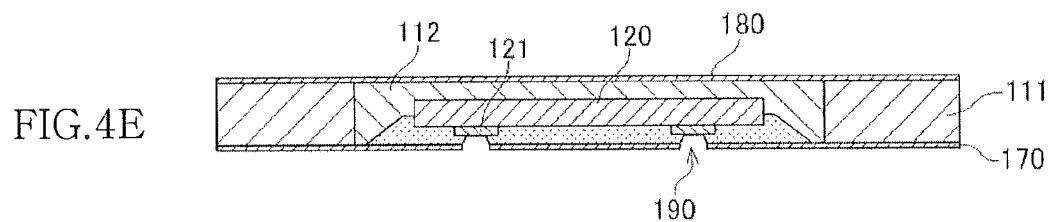

After the resin is cured by the above process, the carrier 150 is peeled as shown in FIG. 4C. Then, as shown in FIG. 4D, patterning of the metallic foil 170 is carried out, thereby removing portions of the metallic foil 170 that are immediately below the external terminals 121. Then, as shown in FIG. 4E, vias 190 are formed in the die attach paste 122 by using the patterned metallic foil 170 as a mask. As a result, the external terminals 121 are exposed. Incidentally, if the resin that has flowed in due to the thermal pressing is located immediately below the external terminals 121, the vias 190 are formed in the resin.

Figure 5A:
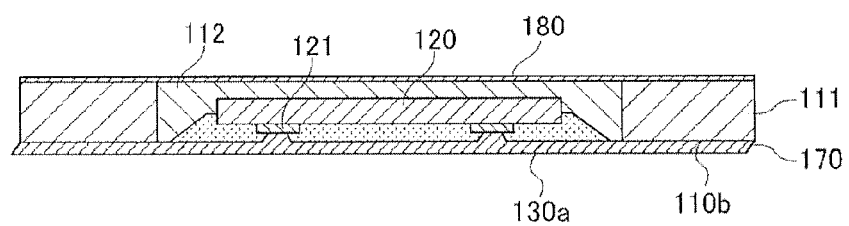
Figure 5B:
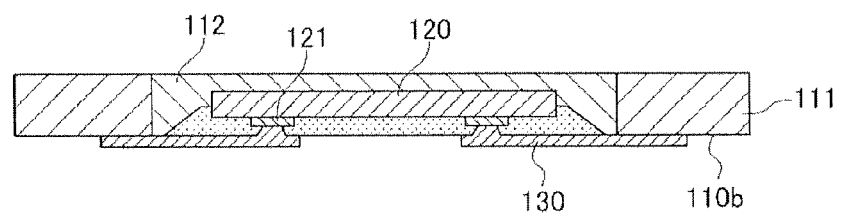
Figure 5C:
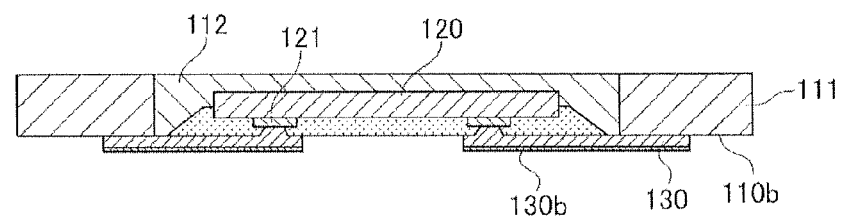
Figure 5D:
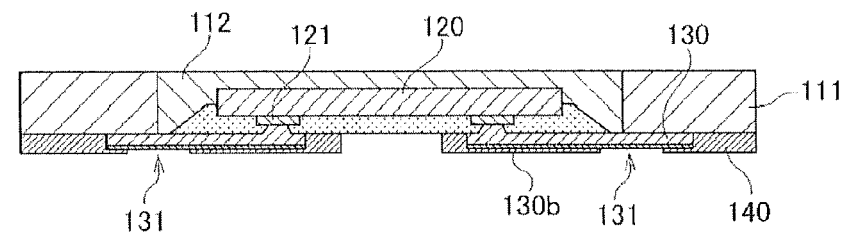

Then, an electroless plating process for covering the inside of the vias 190 with a metallic film, and an electrolytic plating process are performed in that order. As a result, as shown in FIG. 5A, a plating layer 130*a* is formed on the surface 110*b* of the resin substrate 110. Then, as shown in FIG. 5B, patterning of the plating layer 130*a* is performed to form the wiring layer 130. Furthermore, as shown in FIG. 5C, surface treatment is performed, when necessary, to a surface of the wiring layer 130 by using a coating film 130*b* such as gold (Au). Then, as shown in FIG. 5D, the resist film 140 is formed. As a result, the circuit board 100 of the present embodiment is completed.

In that manner, according to the manufacturing method of the circuit board 100 of the present embodiment, the thermal pressing is performed to make the uncured resin, which is contained in the prepreg 111*a*, flow into the through-hole 112*a*. As a result, the semiconductor IC 120 is embedded. Therefore, even if the thickness of the prepreg 111*a* is very thin, the semiconductor IC 120 can be appropriately embedded in the resin.

The configuration and the manufacturing method for the case where the semiconductor IC 120 is mounted in the face-down method have been described above. However, the mounting method of the semiconductor IC 120 is not limited to the face-down method but a face-up method may be used. The following describes the configuration and the manufacturing method for the case where the semiconductor IC 120 is mounted in the face-up method.

Figure 7:
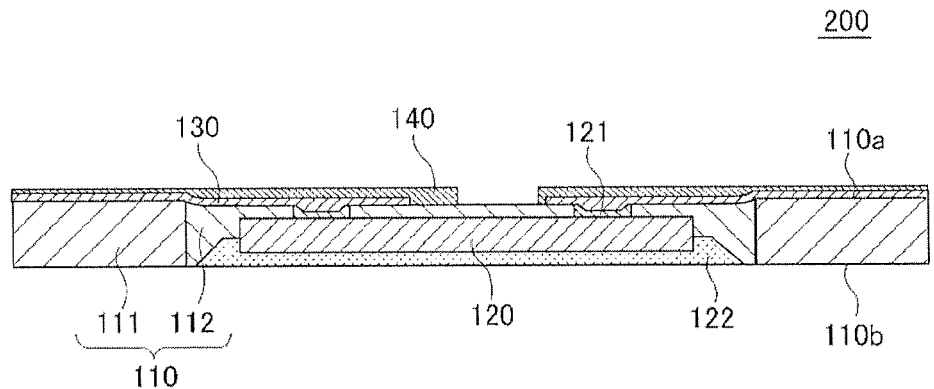
FIG. 7 is a schematic perspective view showing the appearance of a circuit board incorporating a semiconductor IC according to a second preferred embodiment of the present invention.

FIG. 7 is a schematic perspective view showing the appearance of a circuit board 200 incorporating a semiconductor IC according to the second preferred embodiment of the present invention.

As shown in FIG. 7, the circuit board 200 of the present embodiment is different from the above circuit board 100 of the first embodiment in that a die attach paste 122 is provided on a back surface of a semiconductor IC 120. The other parts are basically the same as those of the circuit board 100 of the first embodiment. Therefore, the same components will be represented by the same reference symbols, and a duplicate description will be omitted.

FIGS. 8A to 8E, 9A to 9E and 10A to 10E are work-flow charts illustrating the manufacturing method of the circuit board 200 according to the second embodiment.

Figure 8A:
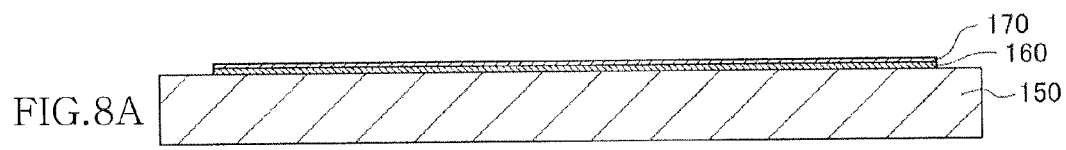
FIGS. 8A to 8E, 9A to 9E and 10A to 10E are work-flow charts illustrating the manufacturing method of the circuit board incorporating a semiconductor IC according to the second embodiment.
Figure 8B:
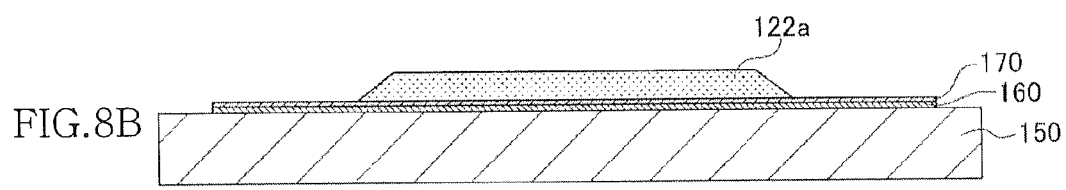
Figure 8C:
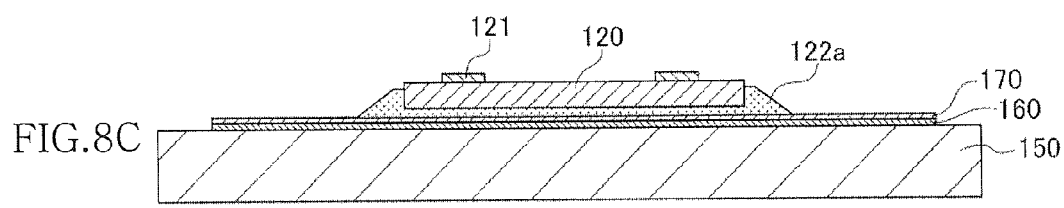
Figure 8D:
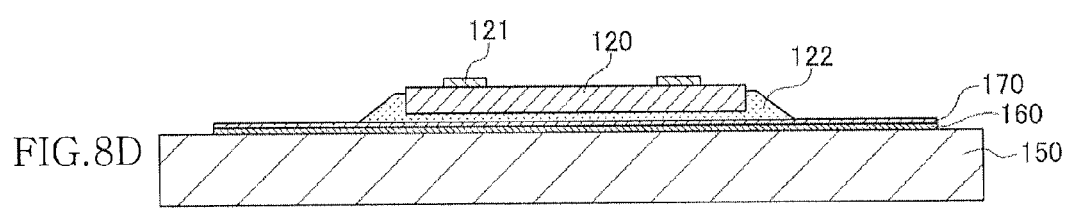

First, as shown in FIG. 8A, a carrier 150 is prepared, and, metallic foil 170 is bonded to a surface of the carrier 150 by an adhesive sheet 160. Then, as shown in FIG. 8B, an uncured die attach paste 122*a* is supplied onto a surface of the metallic foil 170. The above processes are the same as those shown in FIGS. 3A and 3B. After that, according to the present embodiment, the semiconductor IC 120 is mounted on the die attach paste 122*a* by the face-up method as shown in FIG. 8C. According to the face-up method, a main surface where external terminals 121 are formed faces an upper side (or a side opposite to the die attach paste 122*a*). Then, the die attach paste 122*a* is cured, and the semiconductor IC 120 is fixed to the carrier 150 as shown in FIG. 8D.

Figure 8E:
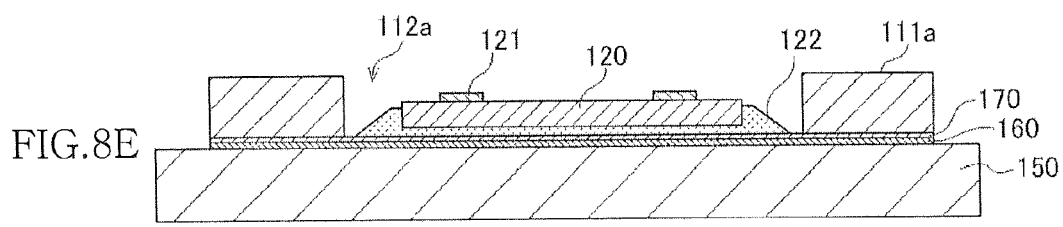
Figure 9A:
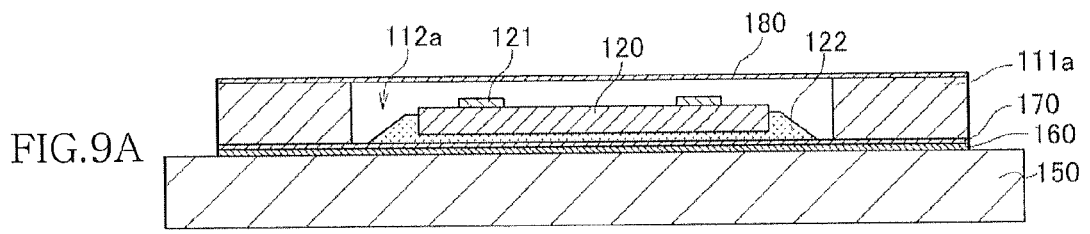
Figure 9B:
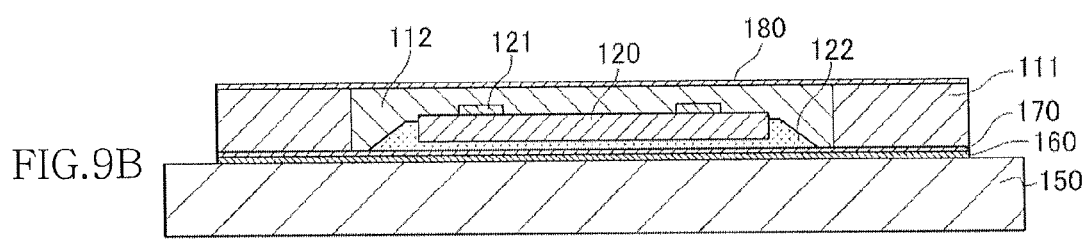

The subsequent processes are almost the same as those of the first embodiment. A prepreg 111*a* is bonded onto the carrier 150 in such a way that the semiconductor IC 120 is housed in a through-hole 112*a* (FIG. 8E). Then, metallic foil 180 is bonded in such a way as to cover the prepreg 111*a* (FIG. 9A). In this state, the upper and lower sides of the prepreg 111*a* are thermally pressed (FIG. 9B). As a result, part of the resin with which the prepreg 111*a* is impregnated flows into the through-hole 112*a*, and the semiconductor IC 120 that is housed in the through-hole 112*a* is embedded in the resin that has flowed in.

After the above processes are completed, the carrier 150 can be peeled in any stage. According to the present embodiment, since a wiring layer 130 is not provided on a surface 110*b* that is on a side where the carrier 150 is provided, the carrier 150 can be peeled in any stage after the above processes are completed. The following describes, as an example, the case where the processes are performed without peeling the carrier 150 until immediately before a final process.

Figure 9C:
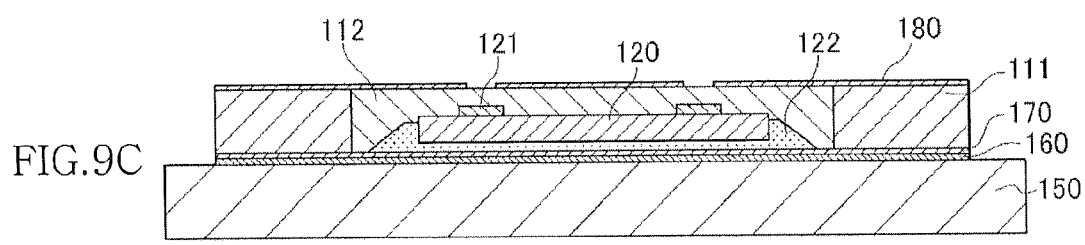
Figure 9D:
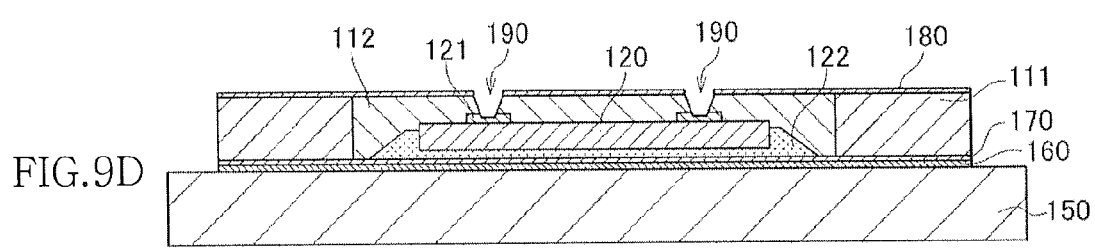
Figure 9E:
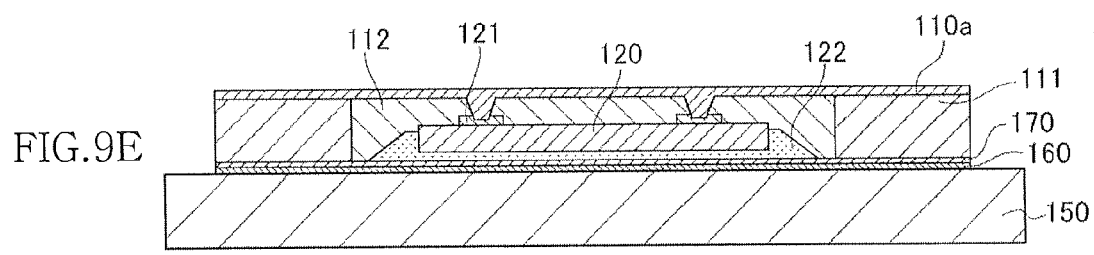
Figure 10A:
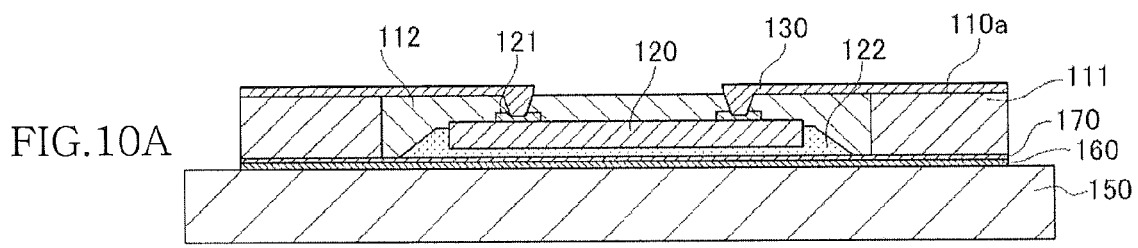
Figure 10B:
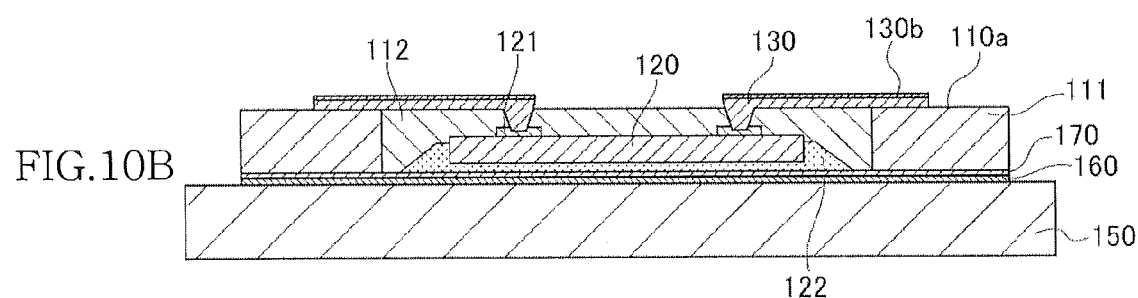
Figure 10C:
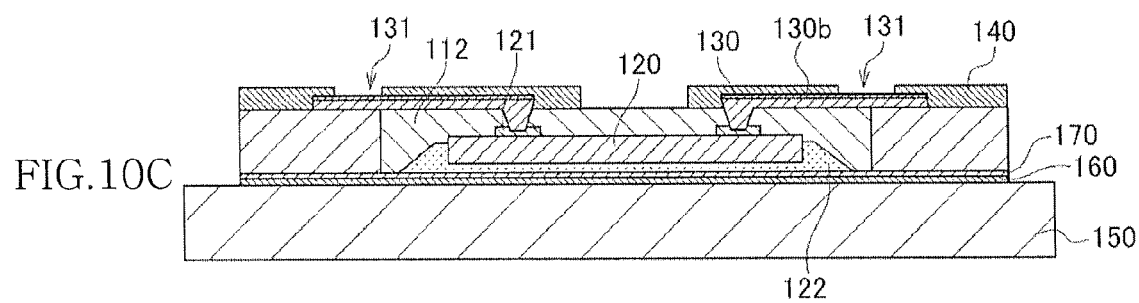
Figure 10D:
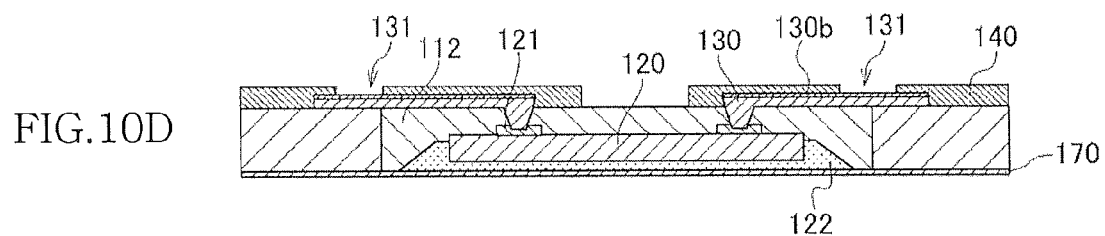

After the resin is cured by the above process, patterning of the metallic foil 180 is carried out (FIG. 9C). The patterned metallic foil 180 is used as a mask, and vias 190 are formed in the resin that constitutes the housing section 112 (FIG. 9D). Then, a plating layer 130*a* is formed on the surface 110*a* of the resin substrate 110 (FIG. 9E), and patterning of the plating layer 130*a* is then performed to form the wiring layer 130 (FIG. 10A). Furthermore, surface treatment is performed, when necessary, to a surface of the wiring layer 130 by using a coating film 130*b* (FIG. 10B). Then, a resist film 140 is formed (FIG. 10C).

Figure 10E:
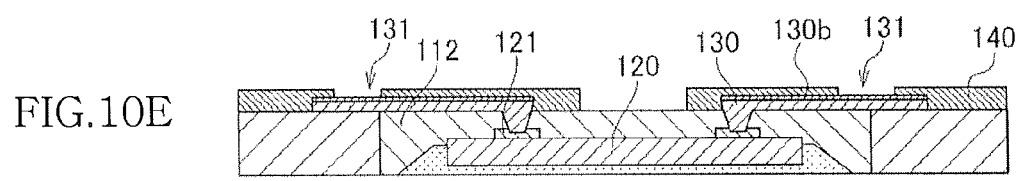

Then, the resin substrate 110 is peeled from the carrier 150 (FIG. 10D), and etching is carried out to remove the metallic foil 170 (FIG. 10E). As a result, the circuit board 200 of the present embodiment is completed. Incidentally, the processes of FIGS. 10A to 10E are not necessarily performed in the above-described order. For example, a process of peeling the resin substrate 110 (FIG. 10D), a process of patterning of the plating layer 130*a* (FIG. 10A), a process of removing the metallic foil 170 (FIG. 10E), a process of forming the resist film 140 (FIG. 10C), and a surface-treatment process of the wiring layer 130 (FIG. 10B) may be carried out in that order.

As described above, the circuit board 200 in which the semiconductor IC 120 is mounted by the face-up method is produced. The circuit board 200 of the present embodiment can achieve substantially the same advantageous effects as the circuit board 100 of the first embodiment does.

Figure 11:
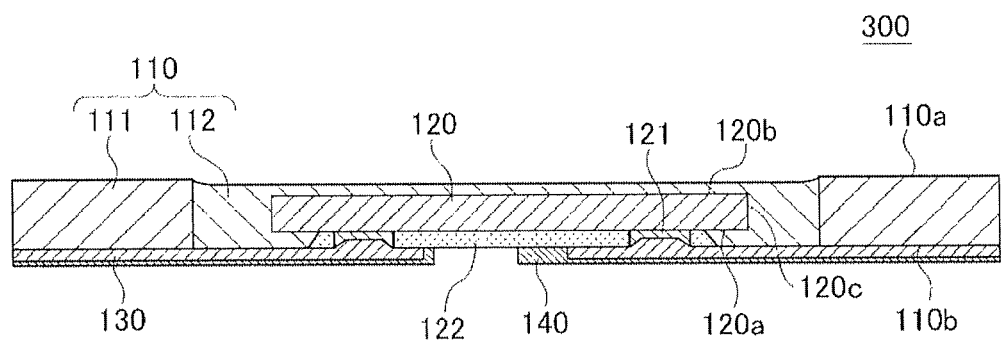
FIG. 11 is a schematic perspective view showing the appearance of a circuit board incorporating a semiconductor IC according to a third preferred embodiment of the present invention.

FIG. 11 is a schematic perspective view showing the appearance of a circuit board 300 incorporating a semiconductor IC according to the third preferred embodiment of the present invention.

As shown in FIG. 11, the circuit board 300 of the present embodiment is different from the above circuit board 100 of the first embodiment in that a die attach paste 122 is bonded only to part of a main surface 120*a* of a semiconductor IC 120, and the remaining portion is covered with resin that fills a housing section 112. The other parts are basically the same as those of the circuit board 100 of the first embodiment. Therefore, the same components will be represented by the same reference symbols, and a duplicate description will be omitted. Incidentally, an entire back surface 120*b* of the semiconductor IC 120 is covered with the resin that fills the housing section 112. It is preferred that an entire side surface 120*c* of the semiconductor IC 120 be also covered with the resin that fills the housing section 112. The configuration reduces a difference in thermal expansion coefficient between a region above the semiconductor IC 120 and a region below the semiconductor IC 120. As a result, the semiconductor IC 120 becomes unlikely to be warped or crack.

In order to obtain the above configuration, in the process shown in FIG. 3B, an area coated with an uncured die attach paste 122*a* is reduced. The semiconductor IC 120 is bonded in such a way that, in the process shown in FIG. 3C, only part of the main surface 120a of the semiconductor IC 120 is in contact with the die attach paste 122a, and that the remaining portion is not in contact with the die attach paste 122a. Moreover, the semiconductor IC 120 is preferably bonded in such a way that the side surface 120c of the semiconductor IC 120 is not in contact with the die attach paste 122a. As a result, the die attach paste 122a does not go behind a back surface 120b of the semiconductor IC 120. Therefore, it is possible to prevent the die attach paste 122a from adhering to a head portion of a mounting tool that handles the semiconductor IC 120.

Figure 12:
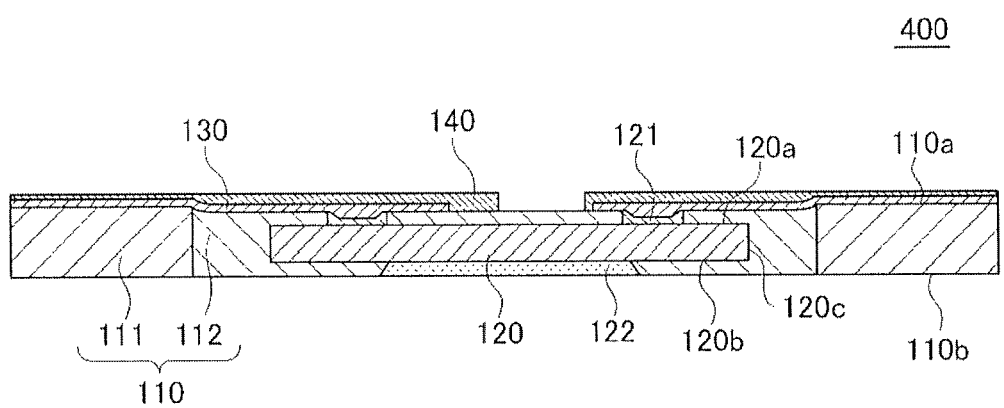
FIG. 12 is a schematic perspective view showing the appearance of a circuit board incorporating a semiconductor IC according to a fourth preferred embodiment of the present invention.

FIG. 12 is a schematic perspective view showing the appearance of a circuit board 400 incorporating a semiconductor IC according to the fourth preferred embodiment of the present invention.

As shown in FIG. 12, the circuit board 400 of the present embodiment is different from the above circuit board 200 of the second embodiment in that a die attach paste 122 is bonded only to part of a back surface 120b of a semiconductor IC 120, and the remaining portion is covered with resin that fills a housing section 112. The other parts are basically the same as those of the circuit board 200 of the second embodiment. Therefore, the same components will be represented by the same reference symbols, and a duplicate description will be omitted. Incidentally, an entire main surface 120a of the semiconductor IC 120 is covered with the resin that fills the housing section 112 except portions where external terminals 121 are provided. It is preferred that an entire side surface 120c of the semiconductor IC 120 be also covered with the resin that fills the housing section 112. The configuration can achieve the same advantageous effects as those of the above third embodiment.

In order to obtain the above configuration, in the process shown in FIG. 8B, an area coated with an uncured die attach paste 122a is reduced. The semiconductor IC 120 is bonded in such a way that, in the process shown in FIG. 8C, only part of the back surface 120b of the semiconductor IC 120 is in contact with the die attach paste 122a, and that the remaining portion is not in contact with the die attach paste 122a. Moreover, the semiconductor IC 120 is preferably bonded in such a way that the side surface 120c of the semiconductor IC 120 is not in contact with the die attach paste 122a. The advantageous effects obtained are the same as those of the above third embodiment.

It is apparent that the present invention is not limited to the above embodiments, but may be modified and changed without departing from the scope and spirit of the invention.

For example, according to the above embodiments, one semiconductor IC 120 is incorporated into the resin substrate 110. However, the number of semiconductor ICs incorporated is not limited to one. Two or more semiconductor ICs may be incorporated. If two or more semiconductor ICs are incorporated, the two or more semiconductor ICs may be embedded in the same resin layer, or in different resin layers. If the semiconductor ICs are embedded in different resin layers, the processes of FIGS. 3B to 5B are repeated.

What is claimed is:

1. A circuit board comprising:
a resin substrate including a core section including a core material that is impregnated with a resin and a housing section filled by the resin, the housing section being separate from the core section and surrounded by the core section so as to penetrate through the core section; and
a semiconductor integrated circuit (IC) embedded in the resin that fills the housing section,
wherein a thickness of the housing section is less than a thickness of the core section, thereby at least one of one and other surfaces of the resin substrate has a dented shape in the housing section.

2. The circuit board as claimed in claim 1, further comprising:
a wiring layer formed on the one surface of the resin substrate and electrically connected to an external terminal of the semiconductor IC; and
a resist film covering the wiring layer.

3. The circuit board as claimed in claim 2, wherein the other surface of the resin substrate is free from any wiring layer.

4. The circuit board as claimed in claim 1, wherein the semiconductor IC includes a main surface where an external terminal is provided and a back surface opposite to the main surface, a first portion of one of the main and back surfaces of the semiconductor IC is covered with an adhesive agent, and a second portion of the one of the main and back surfaces of the semiconductor IC is covered with the resin.

5. The circuit board as claimed in claim 4, wherein the other of the main and back surfaces of the semiconductor IC is entirely covered with the resin.

6. The circuit board as claimed in claim 4, wherein the semiconductor IC has a side surface that is free from the adhesive agent.

7. The circuit board as claimed in claim 1, wherein the semiconductor IC includes a main surface where an external terminal is provided and a back surface opposite to the main surface, one of the main and back surfaces of the semiconductor IC is partially covered with the resin, and the other of the main and back surfaces of the semiconductor IC is entirely covered with the resin.

8. A circuit board comprising:
a resin substrate including a core section including a core material that is impregnated with a resin and a housing section filled by the resin, the housing section being separate from the core section and surrounded by the core section so as to penetrate through the core section;
a semiconductor integrated circuit (IC) embedded in the housing section, the semiconductor IC including an external terminal; and
a wiring layer formed on a first surface of the resin substrate over the core section and the housing section,
wherein the housing section of the resin substrate has a via hole that exposes the external terminal of the semiconductor IC, and
wherein a part of the wiring layer is embedded in the via hole to electrically connect the external terminal of the semiconductor IC.

9. The circuit board as claimed in claim 8, wherein the semiconductor IC is thinned.

10. The circuit board as claimed in claim 9, wherein the thermal pressing causes a part of the resin substrate to flow into the via hole, thereby reducing an amount of the resin substrate in the core section.

11. The circuit board as claimed in claim 10, wherein the thermal pressing first causes a pressure increase on the resin substrate to cause the part of the resin substrate to flow into the via hole and then applies a higher heat temperature to cure the resin substrate.

12. The circuit board as claimed in claim 8, wherein the resin substrate has a second surface that is opposite to the first surface, the second surface of the resin substrate is free from any wiring layer.

13. The circuit board as claimed in claim 12, wherein a thickness of the housing section is less than a thickness of the core section, thereby at least one of the first and second surfaces of the resin substrate has a dented shape in the housing section.

14. The circuit board as claimed by claim 8, further comprising an adhesive agent provided between the semiconductor IC and the wiring layer.

15. The circuit board as claimed in claim 14, wherein the adhesive agent forms a part of the first surface of the resin substrate in the housing section.

16. The circuit board as claimed in claim 15, further comprising a resist film covering the wiring layer, the resist film being in contact with the adhesive agent.

17. A circuit board comprising:
  a resin substrate including a core section including a core material that is impregnated with a resin and a housing section filled by the resin, the housing section being separate from the core section and surrounded by the core section so as to penetrate through the core section, the resin substrate having first and second surfaces opposite to each other;
  a semiconductor IC embedded in the housing section, the semiconductor integrated circuit (IC) having a third surface that faces to the first surface of the resin substrate and a fourth surface that faces to the second surface of the resin substrate, the semiconductor IC including an external terminal on the third surface; and
  a wiring layer formed on the first surface of the resin substrate over the core section and the housing section, the wiring layer being electrically connected to the external terminal of the semiconductor IC,
  wherein the second surface of the resin substrate is free from any wiring layer.

18. The circuit board as claimed in claim 17, wherein the semiconductor IC is thinned.

19. The circuit board as claimed in claim 17, wherein a thickness of the housing section is less than a thickness of the core section, thereby at least one of the first and second surfaces of the resin substrate has a dented shape in the housing section.

20. The circuit board as claimed in claim 19, wherein the thermal pressing causes a part of the resin substrate to flow into the via hole, thereby reducing an amount of the resin substrate in the core section.

\* \* \* \* \*